US006860940B2

(12) United States Patent
Segelke et al.

(10) Patent No.: US 6,860,940 B2
(45) Date of Patent: Mar. 1, 2005

(54) AUTOMATED MACROMOLECULAR CRYSTALLIZATION SCREENING

(75) Inventors: Brent W. Segelke, San Ramon, CA (US); Bernhard Rupp, Livermore, CA (US); Heike I. Krupka, Hayward, CA (US)

(73) Assignee: The Regents of the University of California, Oakland, CA (US)

( * ) Notice: Subject to any disclaimer, the term of this patent is extended or adjusted under 35 U.S.C. 154(b) by 153 days.

(21) Appl. No.: 10/253,130

(22) Filed: Sep. 23, 2002

(65) Prior Publication Data

US 2003/0150375 A1 Aug. 14, 2003

Related U.S. Application Data

(60) Provisional application No. 60/356,184, filed on Feb. 11, 2002.

(51) Int. Cl.[7] ............................................... C30B 25/02
(52) U.S. Cl. ........................... 117/68; 117/13; 117/14; 117/217; 117/218; 117/222; 117/900
(58) Field of Search ............................. 117/13, 14, 217, 117/218, 222, 900

(56) References Cited

U.S. PATENT DOCUMENTS

| | | |
|---|---|---|
| 5,525,198 A | 6/1996 | Craig et al. |
| 5,582,013 A | 12/1996 | Neufeld |
| 5,597,457 A | 1/1997 | Craig et al. |
| 5,961,934 A | 10/1999 | Arnowitz et al. |
| 6,117,232 A | 9/2000 | Sanjoh |

FOREIGN PATENT DOCUMENTS

| | | |
|---|---|---|
| WO | WO 01/09595 A2 | 2/2001 |
| WO | WO 01/51919 A2 | 7/2001 |
| WO | WO 02/26342 A1 | 4/2002 |

OTHER PUBLICATIONS

Ward, K.B. et al., "Automated Preparation of Protein Crystals Using Laboratory Robotics and Automated Visual Inspection," Journal of Crystal Growth 90, Elseiver Science Publishers, (1988), pp. 325–339.

Segelke, B., "Efficiency Analysis of Sampling Protocols Used in Protein Crystallization Screening," PhD thesis, University of California San Diego, (1995), 40 pages.

Segelke, B., "Efficiency Analysis of Sampling Protocols Used in Protein Crystallization Screening," Journal of Crystal Growth, 232, (2001), pp. 553–562.

Brodersen, D., et al., Xact: a program for construction, automated setup and bookkeeping of crystallization experiments, J. Appl. Cryst., (1999), 32, pp. 1012–1016.

*Primary Examiner*—Felisa Hiteshew
(74) *Attorney, Agent, or Firm*—Eddie E. Scott; Alan H. Thompson

(57) ABSTRACT

An automated macromolecular crystallization screening system wherein a multiplicity of reagent mixes are produced. A multiplicity of analysis plates is produced utilizing the reagent mixes combined with a sample. The analysis plates are incubated to promote growth of crystals. Images of the crystals are made. The images are analyzed with regard to suitability of the crystals for analysis by x-ray crystallography. A design of reagent mixes is produced based upon the expected suitability of the crystals for analysis by x-ray crystallography. A second multiplicity of mixes of the reagent components is produced utilizing the design and a second multiplicity of reagent mixes is used for a second round of automated macromolecular crystallization screening. In one embodiment the multiplicity of reagent mixes are produced by a random selection of reagent components.

18 Claims, 2 Drawing Sheets

AUTOMATED MACROMOLECULAR CRYSTALLIZATION SCREENING

CROSS-REFERENCE TO RELATED APPLICATIONS

This application claims the benefit of U.S. Provisional Application No. 60/356,184 filed Feb. 11, 2002 and titled "Automated Macromolecular Crystallization Screening with Random Sampling." U.S. Provisional Application No. 60/356,184, filed Feb. 11, 2002 titled "Automated Macromolecular Crystallization Screening with Random Sampling" is incorporated herein by this reference.

The United States Government has rights in this invention pursuant to Contract No. W-7405-ENG-48 between the United States Department of Energy and the University of California for the operation of Lawrence Livermore National Laboratory.

BACKGROUND

1. Field of Endeavor

The present invention relates to X-ray crystallography and more particularly to automated macromolecular crystallization screening.

2. State of Technology

U.S. Pat. No. 5,597,457 for a system and method for forming synthetic protein crystals to determine the conformational structure by crystallography to George D. Craig, issued Jan. 28, 1997 provides the following background information, "The conformational structure of proteins is a key to understanding their biological functions and to ultimately designing new drug therapies. The conformational structures of proteins are conventionally determined by x-ray diffraction from their crystals. Unfortunately, growing protein crystals of sufficient high quality is very difficult in most cases, and such difficulty is the main limiting factor in the scientific determination and identification of the structures of protein samples. Prior art methods for growing protein crystals from super-saturated solutions are tedious and time-consuming, and less than two percent of the over 100,000 different proteins have been grown as crystals suitable for x-ray diffraction studies."

International Patent No. WO0109595 A2 for a method and system for creating a crystallization results database to Lansing Stewart et al., published Feb. 8, 2001, provides the following background information, "Macromolecular x-ray crystallography is an essential aspect of modern drug discovery and molecular biology. Using x-ray crystallographic techniques, the three-dimensional structures of biological macromolecules, such as proteins, nucleic acids, and their various complexes, can be determined at practically atomic level resolution. The enormous value of three-dimensional information has led to a growing demand for innovative products in the area of protein crystallization, which is currently the major rate limiting step in x-ray structure determination. One of the first and most important steps of the x-ray crystal structure determination of a target macromolecule is to grow large, well diffracting crystals with the macromolecule. As techniques for collecting and analyzing x-ray diffraction data have become more rapid and automated, crystal growth has become a rate limiting step in the structure determination process."

U.S. Pat. No. 6,368,402 for a method for growing crystals to George T. DeTitta et al. issued Apr. 9, 2002, provides the following background information, "A number of investigators have attempted to condense their experiences in the crystal growth laboratory into a list of recipes of reagents that have found success as crystallizing agents. The most used of these is the list compiled by Jancarik, J. and Kim, S.-H. (1991), J. Appl. Cryst. 24, 409–411 which is often referred to as the "sparse matrix sampling" screen. The list is a "heavily biased" selection of conditions out of many variables including sampling pH, additives and precipitating agents. The bias is a reflection of personal experience and literature reference towards pH values, additives and agents that have successfully produced crystals in the past. Commercialization of the sparse matrix screen has led to its popularity; easy and simple to use, it is often the first strategy in the crystal growth lab. The agents chosen by Jancarik and Kim are designed to maximize the frequency of precipitation outcomes for a broad variety of proteins. They were chosen because in a large percentage of experiments employing them "something happened.""

U.S. Pat. No. 5,961,934 for a dynamically controlled crystallization method and apparatus and crystals obtained thereby to Leonard Arnowitz and Emanuel Steinberg, issued Oct. 5, 1999, provides the following background information, "The concept of rational drug design involves obtaining the precise three dimensional molecular structure of a specific protein to permit design of drugs that selectively interact with and adjust the function of that protein. Theoretically, if the structure of a protein having a specified function is known, the function of the protein can be adjusted as desired. This permits a number of diseases and symptoms to be controlled. For example, CAPTOPRIL is a well known drug for controlling hypertension that was developed through rational drug design techniques, CAPTOPRIL inhibits generation of the angiotension-converting enzyme thereby preventing the constriction of blood vessels. The potential for controlling disease through drugs developed by rational drug design is tremendous. X-ray crystallography techniques are utilized to obtain a "fingerprint," i.e. the precise three-dimensional shape, of a protein crystal. However, a critical step to rational drug design is the ability to reliably crystallize a wide variety of proteins. Therefore, a great deal of time and money have been spent crystallizing proteins for analysis."

International Patent No. WO02/26342 for an automated robotic device for dynamically controlled crystallization of proteins to Leonard Arnowitz et al., published Apr. 4, 2002, provides the following background information, "There is a pressing need for reliable, high yield, high quality crystallization procedures for rational/structural drug design. Existing screening methods including traditional vapor diffusion experiments, automated systems, and commercial screens are inadequate. For example, once a vapor diffusion experiment is set up with a target concentration of the precipitant used, it cannot be modified. This prolongs the optimization process, and makes it nearly impossible to screen effectively a large number of conditions without a large time commitment and large quantities of protein.

Despite its increasing commercial importance, the science underlying crystal growth is incomplete and it is nearly impossible to predict the conditions under which a newly studied protein will crystallize (Ries-Kautt, M., et al., Inferences drawn from Physicochemical Studies of Crystallogenesis and the Precrystalline State: Macromolecular Crystallography. Methods, Eizzyinol. 1997, 276, 23–59; McPherson, A., Crystallization of Biological Macromolecules: Cold Spring Harbor Laboratory Press: Cold Spring Harbor, N.Y., 1999; Ducruix. A., and Giege R., Eds., Crystallization of Nucleic Acids and Proteins: A Practical Approach; ML Press: Oxford, United Kingdom, 1992). The process of protein crystal growth can be dissected into primary nucleation, and nucleation and growth of its chemically and geometrically constituent layers and rows.

Proteins are typically half water by volume, mechanically fragile, and marginally stable. They are prepared in aqueous solutions and crystals of about 0.2 mm size are usually grown for x-ray diffraction measurements that can lead to detailed structural information. Protein crystals are generally cultivated by slowly dehydrating a solution of the pure protein with a large excess of a selected soluble salt or alcohol called the precipitant, and in addition some lower-concentration co-solutes such as buffers and reducing agents that maintain protein stability. Frequently, crystal growth will display a strong sensitivity to these co-solutes due to interactions with the protein surface. In defiance of systematic science, knowing the conditions that gave crystals for one protein does little to predict conditions for even a closely related protein, and a wide assortment of chemical additives has been found useful for various proteins (Jankarik, T., Kim, S. H. Sparse Matrix Sampling: A Screening Method for Crystallization of Proteins. J AppL Cryst. 1991, 24, pp. 409–411). Due to these sensitivities and the instabilities of the proteins themselves, the process of protein crystal growth nearly always involves searching and scanning to optimize the results (Cudney, R., et al., Screening and Optimization Strategies for Macromolecular Crystal Growth. Acta Cryst. 1994, D50, pp. 414–423) For a new protein, the initial search phase involves a broad scan covering wide arrays of potential additives to identify those that promote crystal growth. In the subsequent optimization phase, the scanning is localized around the conditions that have been found to produce crystals.

Efforts to produce crystals, and then to optimize them for diffraction and structure determination, typically take months to years. Crystallization of a biological molecule such as a protein involves the creation of a supersaturated solution of the molecule under conditions that promote minimum solubility and the orderly transition of the molecules from the solution into a crystal lattice. The variables that must be controlled precisely to promote crystal growth include temperature, protein solution concentration, salt solution concentration, pH, and gravitational field, for example (Durbin, S., Felier, G., Ann. Rev. Phys. Chem., 1996, 47, pp. 171–204). These variables are carefully controlled and optimum combinations thereof are determined through experimentation to yield superior crystals.

Removal of water from the protein solution is usually effected by vapor diffusion, by dialysis, or by direct mixing with hypertonic media (Weber, -P. C. Overview of Protein Crystallization Methods: Macromolecular Crystallography. Methods EnrynioL 1997, 276, pp. 13 22). Dialysis methods use a hygroscopic reservoir to remove water. A polysaccharide semipermeable membrane is utilized that blocks passage of the protein but permits water and precipitant to pass through (in opposite directions). A key practical difference is that in vapor diffusion the (usually nonvolatile) precipitant must be premixed with the protein, whereas for dialysis no premixing step is needed since the precipitant can usually traverse the membrane.

Ordinarily the dialysate is not changed (static dialysis) and the precipitant level in the protein chamber increases rapidly at fast, then more slowly. If the precipitant concentration rises too quickly, excess nucleation occurs, while if the trajectory is slower, growth of a few crystals may be favored. If the rise in precipitant concentration occurs too slowly, competing processes like protein aggregation and denaturation may interfere. With direct mixing or batch methods, the protein solution is simply mixed with a precipitant solution. This does not formally remove water, but like the other methods, it raises the concentration of precipitant in the protein compartment and thus decreases protein solubility to promote crystal growth.

A DCCS™ dialysis-based reactor for protein crystal growth, featuring dynamic control of the dialysate is described in commonly-owned U.S. Pat. No. 5,961,934, and in International Publication No. WO 99/4219 1, the contents of which are incorporated herein by reference in their entirety. An embodiment comprises a crystallization chamber that is divided by a semipermeable membrane into two compartments, a reactant chamber and a reagent chamber. The reactant chamber is filled with a reactant solution, e.g., a solution of protein to be crystallized, and the reagent chamber is filled with a reagent solution, e.g., a precipitant solution. The device works by pumping precipitant-rich reservoir solution through the reagent chamber so as to gradually raise the precipitant level experienced by the protein, under computer control. The reagent solution is connected via tubing to a precipitant supply syringe and also to a drain syringe that begins empty.

The existing DCCS™ technology, although an improvement over all prior techniques, is nonetheless time consuming and requires substantial manpower. With the advent of proteomics, and recent advances in cloning methodology, purification techniques, subsequent data collection, and structural determination procedures, a major bottleneck in the structural determination of proteins is the process of protein crystallization. The Protein Structure Initiative has set the goal of crystallizing and determining the structures of 10,000 proteins in the next 10 years. For the Protein Structure Initiative to be a success, novel crystallization procedures are required to permit the structural determination of a large number of proteins in a high throughput mode. There is therefore a strong need for a crystallization system that allows many independent crystallization conditions to be simultaneously screened and dynamically controlled, with minimal repetition, to improve the screening process and enable crystallization of a large number of proteins independently, and quickly, using parallel processing.

With so many important proteins to be crystallized, there is a need for automation of the crystallization experiments. Robotics enables systematic pipetting of solutions and protein into crystal growth chambers on plates, so that a multiplicity of conditions can be examined more quickly and consistently. The use of robotics provides accuracy and frees valuable time for researchers. Another trend is the use of semi-automated techniques to record results. However, these steps do not avoid the bottleneck of the crystallization process itself.

Protein structure research requires not only diffractable protein crystals, but also protein crystals soaked in solutions of heavy atoms, to allow the heavy atoms to bind to the crystallized protein molecules. The resulting heavy atom derivative is useful in obtaining the phase solution needed to determine the structure of the protein. Problems arise because the heavy atom compounds may damage the crystal if present at too high a concentration. In addition, the heavy atom compounds often have low solubility, and so must be used at low concentrations that are barely above the minimum concentration permitting effective binding to the protein. Therefore, as the heavy atom compounds bind the protein and come out of solution, the effective concentration is reduced and further binding is curtailed. Static solutions are typically used to make heavy atom derivatives. It is impossible to predict the optimal concentration of heavy atom to use, and much time and protein are lost in determining solution conditions that are suitable for producing heavy atom derivatives. A dynamic high throughput method of heavy metal binding is needed.

Similar problems arise in efforts to bind ligand and drug molecules to crystallized protein molecules M situ. If the concentration of ligand or drug is too high, it may damage the crystal, however, if it is too low, the ligand or drug will not bind to the protein molecules. As with heavy atoms, the low solubility of many ligand and drug molecules compounds the problem.

Dynamic dialysis devices may help by permitting the concentration of heavy atom compound, ligand, or drug to be gradually increased in a controlled manner. By observing the crystal through a transparent side of the crystallization chamber, damage to the crystal might be detected at an early stage, and the concentration of heavy atom compound, ligand, or drug lowered accordingly. By constantly refreshing the reactant solution, the concentration of heavy atom compound, ligand, or drug can be held constant, even though molecules leave solution upon binding to the protein molecules. However, to test a large number of different combinations of proteins and reactant solutions to produce crystals, heavy atom derivatives, or in situ complexes of crystallized protein and ligand or drug, insuperable difficulties are encountered in attempting to monitor the states of the samples in each reactant chamber, and to adjust the concentration of reagent in response to the observed states of the samples. The more samples that are screened, and the more closely the samples are monitored, the greater the difficulties encountered. There is thus a need for an improved, automated system for dynamically controlled crystallization of proteins by dialysis."

SUMMARY

Features and advantages of the present invention will become apparent from the following description. Applicants are providing this description, which includes drawings and examples of specific embodiments, to give a broad representation of the invention. Various changes and modifications within the spirit and scope of the invention will become apparent to those skilled in the art from this description and by practice of the invention. The scope of the invention is not intended to be limited to the particular forms disclosed and the invention covers all modifications, equivalents, and alternatives falling within the spirit and scope of the invention as defined by the claims.

The present invention provides a system of automated macromolecular crystallization screening of a sample. Initially, reagent components are selected from a set of reagents and a set of a multiplicity of reagent mixes are produced. A multiplicity of analysis plates are produced utilizing the reagent mixes wherein each analysis plate contains a set format of reagent mixes combined with the sample. The analysis plates are incubated to promote growth of crystals in the analysis plates. Images of the crystals are made. The images are analyzed with regard to suitability of the crystals for analysis by x-ray crystallography. A design of reagent mixes is produced based upon the expected suitability of the crystals for analysis by x-ray crystallography. If the crystals are not ideal, a second multiplicity of mixes of the reagent components is produced utilizing the design. The second multiplicity of reagent mixes are used for automated macromolecular crystallization screening the sample. The second round of automated macromolecular crystallization screening may produce crystals that are suitable for x-ray crystallography. If the second round of crystallization screening does not produce crystals suitable for x-ray crystallography a third reagent mix design is created and a third round of crystallization screening is implemented. If necessary additional reagent mix designs are created and analyzed.

In one embodiment of the invention a reagent selection means provides a random selection of reagents. In another embodiment of the invention an automated macromolecular crystallization screening apparatus is provided. The apparatus comprises a source of reagent components, a reagent selection means for creating a multiplicity of reagent mixes of the reagent components, means for creating a multiplicity of analysis plates wherein each of the analysis plates contains a set format of the reagent mixes combined with the sample, incubation means for promoting growth of crystals in the analysis plates, camera means for creating an image of the crystals, computer means for analyzing the images with regard to suitability of the crystals for analysis by x-ray crystallography, the computer means providing a design of reagent mixes, and programmed reagent selection means for creating a second multiplicity of mixes of the reagent components utilizing the design of reagent mixes.

The invention is susceptible to modifications and alternative forms. Specific embodiments are shown by way of example. It is to be understood that the invention is not limited to the particular forms disclosed. The invention covers all modifications, equivalents, and alternatives falling within the spirit and scope of the invention as defined by the claims.

BRIEF DESCRIPTION OF THE DRAWINGS

The accompanying drawings, which are incorporated into and constitute a part of the specification, illustrate specific embodiments of the invention and, together with the general description of the invention given above, and the detailed description of the specific embodiments, serve to explain the principles of the invention.

DETAILED DESCRIPTION OF THE INVENTION

Figure 1:
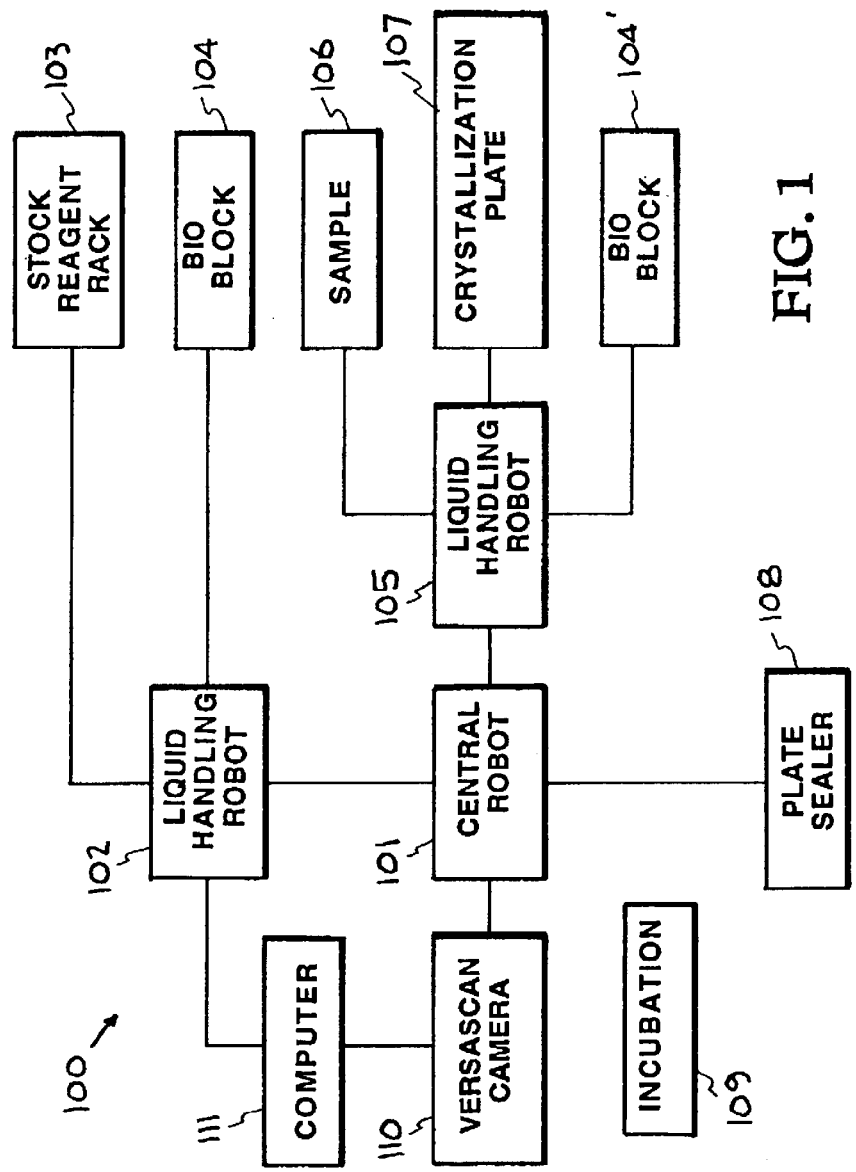
FIG. 1 illustrates one embodiment of a system constructed in accordance with the present invention.

Referring now to the drawings, to the following detailed information, and to incorporated materials; a detailed description of the invention, including specific embodiments, is presented. The detailed description serves to explain the principles of the invention. The invention is susceptible to modifications and alternative forms. The invention is not limited to the particular forms disclosed. The invention covers all modifications, equivalents, and alternatives falling within the spirit and scope of the invention as defined by the claims.

Referring now to FIG. 1, one embodiment of a system constructed in accordance with the present invention is illustrated. The system is designated generally by the reference numeral 100. The system 100 provides an automated system for sustainable high-throughput crystallization screening. Crystallization screening is used in connection with X-ray crystallography.

X-ray crystallography is a technique that exploits the fact that X-rays are diffracted by crystals. X-rays have the proper wavelength (in the Angstrom range, ~10–8 cm) to be scattered by the electron cloud of an atom of comparable size. Based on the diffraction pattern obtained from X-ray scattering off the periodic assembly of molecules or atoms in the crystal, the electron density can be reconstructed. Additional phase information is extracted either from the diffraction data or from supplementing diffraction experiments to complete the reconstruction.

The objective of a de novo protein crystallization project is to arrive at a condition that induces the formation of ordered precipitates. Currently there is no way to arrive at such a condition a priori and one is obliged to empirically test a series of precipitating conditions. Generally, several factors that influence protein solubility, such as salt concentration, pH, and temperature, are used in combination to induce precipitation. The total number of possible experiments arrived at by combining all possible factors influencing protein solubility, at all usable levels, is so large as to prevent examining them exhaustively. In many cases it is not only impractical to search through a large set of combinations, it is imperative to arrive at conditions for crystal growth in the fewest possible crystallization trials due to scarcity of materials.

Proteins consist of long macromolecule chains made up from 20 different amino acids. The chains can be several hundred residues long and fold into a 3-dimensional structure. Protein molecules have irregular shapes and are not ideally suited to be stacked into a periodic lattice, i.e., a crystal. Protein crystals are fragile, soft (think of a cube of jelly instead of a brick) and sensitive to all kind of environmental variations. Protein crystals contain on average 50% solvent, mostly in large channels between the stacked molecules on the crystal. The interactions holding the molecules together are usually weak, hydrogen binds, salt bridges, and hydrophobic interactions, compared to strong covalent or ionic interactions in mineral crystals. This explains the fragility of the crystals, but allows for the possibility of soaking metal solutions (important for phasing) or even large enzyme substrates or inhibitors, into the crystals.

In order to obtain a crystal, the protein molecules must assemble into a periodic lattice. It begins with a solution of the protein with a fairly high concentration (2–50 mg/ml) and adds reagents that reduce the solubility close to spontaneous precipitation. By slow further concentration, and under conditions suitable for the formation of a few nucleation sites, small crystals may start to grow. Often very many conditions have to be tried to succeed. This is usually done by initial screening, followed by a systematic optimization of conditions Crystals should to be a few tenths of a mm in each direction to be useful for diffraction.

The most common setup to grow protein crystals is by the hanging drop technique: A few microliters of protein solution are mixed with an about equal amount of reservoir solution containing the precipitants. A drop of this mixture is put on a glass slide which covers the reservoir. As the protein/precipitant mixture in the drop is less concentrated than the reservoir solution, water evaporates from the drop into the reservoir. As a result the concentration of both protein and precipitant in the drop slowly increases, and crystals may form. There are other techniques available such as sitting drops, dialysis buttons, and gel and microbatch techniques.

The system 100 provides inherently efficient random screen for crystallization conditions and the system 100 can be easily modified and customized. The crystallization robot system provides reproducibly. The system 100 is constructed by technological adaptation and innovation utilizing generally available existing commercial components. The components are available at moderate cost. The commercial components are programmed for seamless integration with an automated crystallization design tool. The system 100 has use in structural genomics, high-throughput macromolecular structure determination by x-ray crystallography, proteomics, drug design, pharmaceutical research and development, drug screening, basic biology research, public health, and counter bio-terrorism.

Components of the system 100 include: a central robot 101; a liquid handling robot 102; a stock reagent rack 103; a bioblock 104; a second liquid handling robot 105; a sample container 106; a crystallization plate 107; a plate sealer robot 108; an incubator unit 109; a camera 110; and a computer 111. The central robot 101 is also know as a plate crane. The liquid handling robot 102 can for example be a HP II HT robot. The liquid handling robot 102 can for example be a Hydra-Plus-One robot. The camera 110 can be for example a VersaScan camera.

The system 100 was developed to generate fully customizable random screens of arbitrary numbers of crystallization experiments from premixed stock reagents. The stock reagent rack 103 contains a number of reagents. The reagents currently used comprise 90 stock solutions, divided into 5 groups: precipitant, buffer, pH, additive and detergent. The concentrations and pHs of the stock solutions are chosen within the user-defined ranges. It is understood that system may contain fewer or more reagents and that the types of reagents may be varied.

The liquid handling robot 102 program output contains specific information about the location and volume of all reagents in reagent rack 103 to be aspirated by the liquid handling robot 102 and the destination for dispense. In one embodiment the liquid handling robot 102 is a HP II HT robot. The liquid handling robot has been programmed to handle the run time instructions supplied by computer 111. The robot instructions consist of a series of stand-alone procedures customized to handle various stock-solution viscosity ranges by reading in the corresponding robot "performance" file but also by adjusting flush/wash cycles. The information in the performance files comprises variables such as volume dependent aspiration and dispense speeds, air gaps, delay times, etc.

The reagents are held on the stock reagent rack 103 in a stainless steel metal rack with a footprint to fit on the robot deck. This rack can hold more than 100 stock solutions of 50, 15 and 5 ml vials, depending on the frequency of use for each stock solution. The liquid handling robot 102 is "trained" on the rack specifications for each vial position. With this embodiment's current implementation a CRYSTOOL-Screen consisting of 1 ml each of 96 conditions is dispensed in to a 96-well deep-well plate in under 3 h.

The liquid handling robot 102 sets up completed crystallization experiments into 96-well sitting drop plates, bioblock 104, by simple mother-daughter-transfer from a premixed screen and a 1 to 96 well transfer of protein stock solution. There is sufficient reagent for setting up crystallization experiments for four proteins from one deep-well plate with a total setup time of ~10 min per protein per plate. The reagent mixes in bioblock 104 are purely random. The inherent efficiency of random screening techniques has been demonstrated by applicants.

The liquid handling robot 102 allows custom labware and integration with other automated devices. The liquid handling robot 102 has 8 independent washable tips that can pipett volumes from 1 ul to 1 ml. The tips are washable, stainless steel and Teflon®-coated. Built in liquid-level-sensing technology performs down to 50 μl and can sense both ionic and non-ionic liquids. The tips can spread from 9 mm to 20 mm and automatic computer controlled variable sample probe spacing is provided to accommodate the labware and methodologies. Routine procedures provide cross-contamination control of the sampling tips with in- and external washing via a peristaltic pump. The system is controlled by WinPREP® applications software (under Windows NT®), a graphical user interface that allows programming of liquid-handling protocols and allows the user to directly import text- and comma delimited files as well as interpretable MSL—(MultiPROBE Script Language) or C++-scripts.

The bioblock 104 is initially in-place in the liquid handling robot 102 as shown in FIG. 1. The central robot transfers the bioblock 104 from the liquid handling robot 102 to the liquid handling robot 105. A second bioblock 104' is shown in place in the liquid handling robot 105. This illustrates the central robot transferring a bioblock from the liquid handling robot 102 to the liquid handling robot 105.

The liquid handling robot 105 utilizes samples from the sample containing unit 106 and reagent mixes form the bioblock 104' to place samples in the 96 position crystallization plate 107. The liquid handling robot 105 sets up completed crystallization experiments into 96-well sitting drop plates, bioblock 104', by simple mother-daughter-transfer from a premixed screen and a 1 to 96 well transfer of protein stock solution."

The crystallization plate 107 is moved to platesealer robot 108 by the central robot 101. The 96 well crystallization plate 107 is sealed with clear film. The crystallization plate 107 is moved to an incubation unit 109 by the central robot 101. The incubation unit may be refrigerated and the crystallization plate 107 is incubated long enough to allow crystals to form. The platesealer robot 108 and incubation unit 109 are well know in the art and may be commercially available units. The platesealer robot 108 and incubation unit 109 can be combined as a single until in another embodiment of the invention.

The crystallization plate 107 is moved from the incubator unit 109 to the camera unit 110 by the central robot 101. Camera robots are well know in the art. The camera 110 can be for example a VersaScan camera in another embodiment of the present invention. The camera 110 captures images of each of the 96 wells in the crystallization plate 107 and shows the crystals that have been formed. Images of the crystals are transferred to computer 111.

Computer 111 identifies the wells in the crystallization plate 107 that have the most promising crystals. Computer system for analyzing images are well know in the art. The computer 111 analyzes the results of images of the crystals that have been formed in the crystallization plate 107 and establishes a new set of test specifications. The new set of specifications are used for another crystallization experiment by processing in the manner previously explained; however, instead of starting with purely random reagent mixes in bioblock 104, the mixes are produced according to the new set of specifications.

Figure 2:
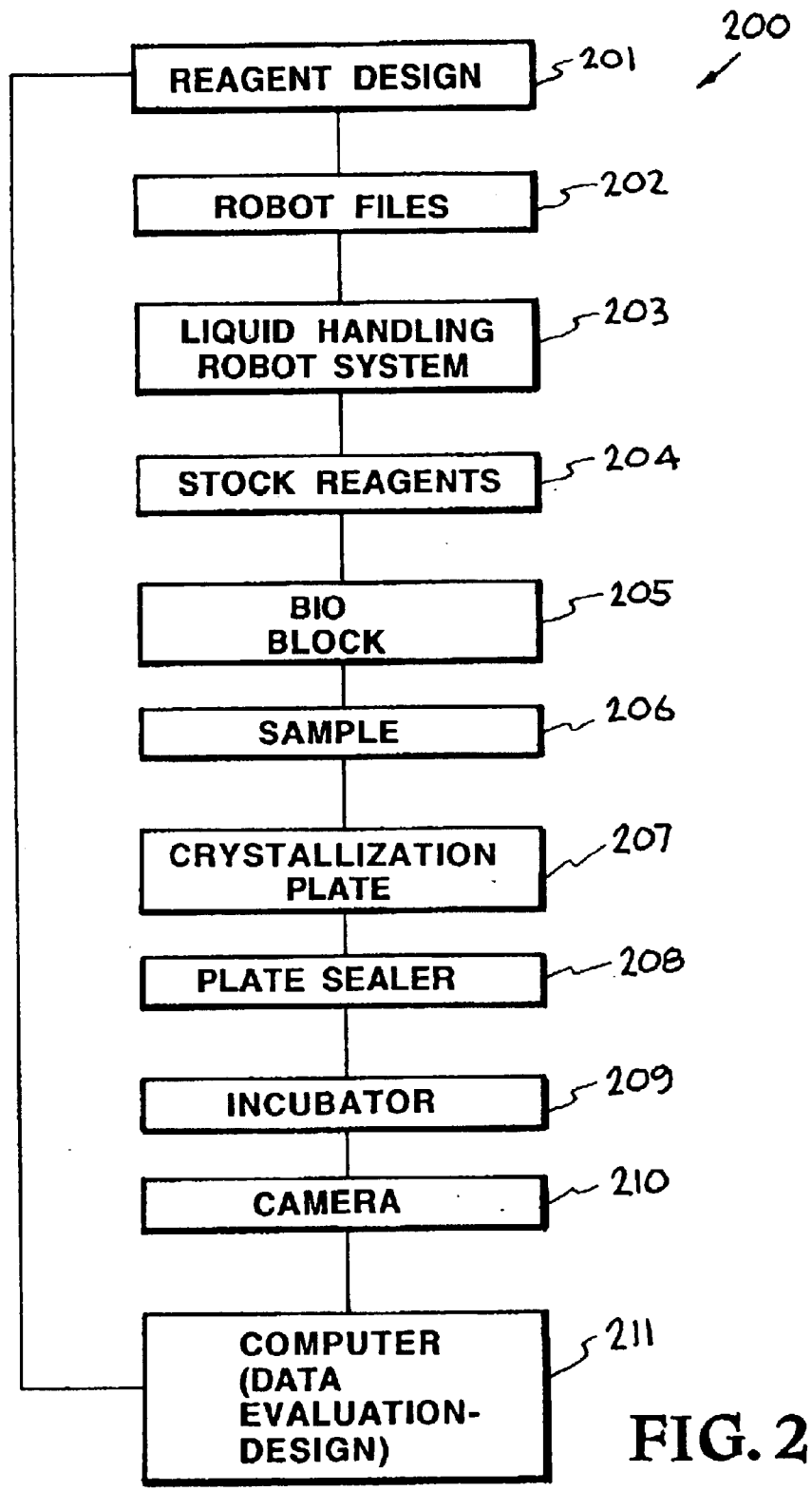
FIG. 2 illustrates another embodiment of a system constructed in accordance with the present invention.

Referring now to FIG. 2, a flow diagram illustrating another embodiment of the present invention and utilizing another method of the present invention is shown. The embodiment is designated generally by the reference numeral 200.

A reagent design 201 is used to create a set of robot files 202. The reagent design is used by a liquid handling robot system 203 to randomly select reagent components from a set of stock reagents 204 and create a multiplicity of reagent mixes in bioblock 205. The initial reagent design is a purely random reagent design.

Sample 206 and bioblock 205 are used with a crystallization plate 207 to create a multiplicity of individual analysis plates within crystallization plate 207 wherein each of the analysis plates receives a set format of the reagent mixes combined with the sample. The crystallization plate 207 is sealed by plate sealer 208 and transferred to an incubator 209 for incubation. Incubation promotes growth of crystals in the analysis plates.

A camera 210 is used to create images of the crystals in the analysis plates. A computer 211 analyzes the images with regard to suitability of the crystals for analysis by x-ray crystallography. The computer 211 provides a reagent mix design that produces specific reagent mixes that are expected to produce the best crystals for analysis by x-ray crystallography.

The reagent mix design is used to create a second multiplicity of mixes of the reagent components. The second multiplicity of reagent mixes are used for another round of automated macromolecular crystallization screening the sample. The second round of automated macromolecular crystallization screening may produce crystals that are suitable for x-ray crystallography. If the second round of crystallization screening does not produce crystals suitable for x-ray crystallography a third reagent mix design is created and analyzed according to the method.

In the human genome for, e.g., the estimated total number of 26,000 to 38,000 protein coding genes (Venter et al., 2001) is expected to be exceeded by the number of actually expressed proteins by an order of magnitude (believed to be more than a million) as a result of splice variants, posttranslational modifications, etc. To meet the challenge of proteomics, several large-scale structural genomic projects have been initiated. In the United States alone the Protein Structure Initiative (PSI) of the National Institute of General Medical Sciences (NIGMS) and the National Institute of Allergy and Infectious Disease (NIAID) has launched nine structural genomics centers. Their efforts focus on obtaining atomic-resolution 3-D protein structures of whole genomes that will ultimately represent all domain folds present in the biosphere and provide representative structures for all individual protein families.

One of the major bottlenecks in order to reach the capacity necessary for large-scale structure determination is the availability of highly diffracting protein crystals. The most promising way to increase the rate of determined protein structures is the automated performance of a large number of crystallization trials to meet this demand in protein crystallization.

Applicants have demonstrated advantages of random screening techniques. Applicants have generated any number of random combinations of crystallization conditions from a large set of starting stock-solutions and have interfaced the random screening to an automated liquid-handling system. The liquid-handling system allows for random access pipetting of stock-solutions with aspiration and dispense speeds tuned for stock-solution viscosities over a range of volumes (5 ul–3 ml). All necessary parameters for setup of a fully customizable set of crystallization experiments are supplied at run time; machine performance related parameters are preprogrammed into the setup protocol. A thorough screen for one protein consists of 288 experiments, based on the preposition that the crystallization success rate for most proteins is 2% or higher. One ml of a full screen is pipetted into three 96-well plates in under 3 h. Throughput is estimated at 10 plates per day yielding 960 different crystallization experiments.

Using 90 stock solutions, the system can generate over 30 million unique experiments. Mixing only 96 of these experiments from pre-made stock solutions by hand takes about 12 hours. Therefore clearly setting up of experiments at a larger scale can only be achieved by using automated devices. A fully customizable program that will generate over 30 million random combinations of crystallization conditions has been produced. The set of precipitants, additives and buffers in various concentration and pH ranges used currently consists of 90 manually premixed stock solutions. The worksheet lists all of the available stock solutions, divided into 5 groups: precipitant, buffer, pH, additive and detergent. The concentrations and pHs of the stock solutions are listed indicating the minimal and maximal possible range. The system has a default frequency assigned to each stock solution. Changes in frequency of each stock solution to individual preferences are automatically adjusted over each particular group whenever the worksheet is edited. After entering the number of experiments to be generated and the desired volume for each condition, the edited worksheet is executed and saved. The system generates an experiment list that lists used stock solutions with concentrations used (in Units of % or molarities) and pH if a buffer was allocated to the particular condition. The system also calculates the amount to be used of each premixed stock solution.

The system is interfaced with a liquid-handling robot system. An automated liquid-handling application demands the operating criteria of customizable functionality and programming flexibility of the system. Tip technology has to encompass independent controllable tips with variable tip movement and separation for a wide dynamic range of volume dispensing (milliliters to microliters) and include carry-over elimination. Further essential capabilities of a robotic pipettor are handling of data files and executable programs as user input.

The system has 8 independent washable tips that can pipett volumes from 1 ul to 1 ml. The tips are washable, stainless steel and Teflon®-coated. Built in liquid-level-sensing technology performs down to 50 µl and can sense both ionic and non-ionic liquids. Varispan™ Variable Tip Separation allows the tips to spread from 9 mm to 20 mm and provides automatic computer controlled variable sample probe spacing to accommodate our custom labware and methodologies. Routine procedures provide cross-contamination control of the sampling tips with in- and external washing via a peristaltic pump. The system is controlled by WinPREP® applications software (under Windows NT®), a graphical user interface that allows programming of liquid-handling protocols and allows the user to directly import text- and comma delimited files as well as interpretable MSL—(MultiPROBE Script Language) or C++-scripts.

Ninety vials of different sizes holding three types volumes: 50 ml, 15 ml and 5 ml. are used. A stain-less steel rack holding up to 100 vials fits on the robot deck. Dependent on the frequency of use each stock solution was assigned a vial with an appropriate volume to allow for continuous processing. With WinPREP, the rack itself and each position in it were defined regarding their X, Y and Z coordinates into a labware called CS_rack. Accordingly, aspirate and dispense heights, travel and search height of the tips are specified. Ninety plates with SDS-footprint are commercially available and fit into the support tiles on the robot deck.

A Millipore Analyzer Feed System AFS-18D is used to provide the MultiPROBE II HT with distilled and degassed water that is used as system liquid. This system filters tap water to consistently-pure, reagent-grade Type I water with a final resistivity of >=10 M☐-cm and bacteria of <=10 cfu/mL at a flow rates of 3–90 L/hr. It further incorporates Millipore's patented degassing technology for removal of dissolved gases (<=3.5 ppm dissolved oxygen) from the final product water.

A component of the interface is the output of the experiments in robot format in combination with a customized liquid-handling protocol programmed in WinPREP application software. Within WinPREP a liquid-handling protocol had to be developed that would create a procedure that would: read in text-files, randomly aspirate various volumes of stock solutions from the CS_rack, randomly dispense them into the according well of 96-well Marsh plates, adapt aspiration and dispense performance for different stock solution viscosities, and eliminate cross-contamination by sufficient wash procedures.

All stock solution are categorized into 4 classes of viscosities: alcohols (A), low viscosity (L), high viscosity (H) and watery solutions (W). Alcohols were easy to identify (Ethanol, 2-Buthanol, Methanol, MPD, Hexandiol, Isopropanol) and teamed up with DMSO. Lower PEGs from 400 to 2000 as well as almost all detergents were categorized as low viscosity. High viscosity are PEGs 5000 and higher as well as glycerol. The category of aqueous solutions comprises all buffers, salts and EDTA.

The WinPREP software uses so called Performance Files, which utilize specific accuracy calibration and settings for aspirate and dispense speeds, waste volumes, transport and system air gaps, blowout volumes, blowout delays, and waste volumes. Three new performance files optimizes pipetting precision and accuracy for the stock solutions of each of the 4 viscosities. For water and watery solutions a WinPREP default Performance File is used. Performance testing was completed on the MultiPROBE II HT and MultiPROBE II systems with WinPREP software.

A separate procedure was created in WinPREP, sorted according to the volatility of the stock solutions. The program starts with the dispense of water. Since the Millipore Analyzer Feed System provides extremely pure and degassed water, the system liquid is used for the required amounts of water in the CRYSTOOL experiments. Subsequently, the procedures for aqueous solutions, low viscosity, high viscosity and finally alcohols are completed to allow for minimum evaporation time. The defined Labware (CS_rack and Marsh plates) are mapped (assigned a specific position on the robot deck with the graphical user interface of WinPREP) and named once and is valid for all subsequent procedures.

To eliminate cross-contamination volumes of wash liquid have been determined for each viscosity group. This is accomplished by adding 10 µl of highly concentrated blue dye to stock solutions and measuring respective absorbances at 631 nm. Subsequently 1 ml of each solution was pipetted with the Packard MP II HP. After flushing and washing the tips the same stock solution was pipetted without dye 10 times. For each pipetting cycle 0.5 ml of dispensed stock solution was collected and spectroscopically tested for remnants of the dye at 631 nm. Different wash volumes were tested and evaluated. For every WinPREP procedure the lowest wash volume without measurable traces of contamination was determined and incorporated.

The programming the liquid-handling protocol assigns each procedure it's specific "Robot file": a comma delimited output generated that includes pipetting volumes, source and destination identifiers and positionings. WinPREP reads these 5 files on run-time and converts the comma delimited file into a column-based spread-sheet. Every single column now has to be mapped correctly within the WinPREP procedure. Fortunately, upon replacing a file with another the program remembers the mapping, so it only has to be set up once, given that always the same file-format is used.

An output file format is used that can be read and interpreted by the MultiPROBE. The software structure of WinPREP suggested a comma delimited file was the format that could be easily generated by CRYSTOOL. A total of five files needed to be generated for each viscosity and the water procedure in the liquid-handling protocol.

First, a number was assigned to each stock reagent in strict correspondence to the positioning in the CS_rack. The previously used name of each stock reagent was then replaced by its number. The number of each stock reagent equals the source position and the source identifier for all source positions is CS_rack (since only one rack is used). The system was then programmed to split all generated experiments into single components with their respective volumes. For the destination identifier, the first 96 experiments were assigned to MarshPlate 1 the second to MarshPlate 2, etc. The destination positioning was assigned column wise (given by the fastest mechanical pipetting process) to each plate identifier. Each line in the generated file now corresponds to information about the destiny of a single stock solution. To be able to sort by viscosities, viscosity flags (A, L, H or W) were added to all stock solutions within the worksheet. Finally the whole experiment list is sorted and divided by viscosities (and water) resulting in the output of 5 comma delimited text files that can be directly supplied to the liquid-handling protocol of the MP II.

After automated pipetting is finished, the plates are sealed manually with Epoxyclear Adhesive Film from Hampton. Mixing of the components is achieved by manually inverting and shaking the sealed plates a couple of times. Bubbles and foaming that can occur due to mixing are eliminated by centrifuging. The crystallization plate is transferred to an incubator for incubation. Incubation promotes growth of crystals in the analysis plates.

A camera is used to create images of the crystals in the analysis plates. A computer analyzes the images with regard to suitability of the crystals for analysis by x-ray crystallography. The computer provides a reagent mix design that produces specific reagent mixes that are expected to produce the best crystals for analysis by x-ray crystallography. The reagent mix design is used to create a second multiplicity of mixes of the reagent components. The second multiplicity of reagent mixes are used for another round of automated macromolecular crystallization screening the sample. The second round of automated macromolecular crystallization screening may produce crystals that are suitable for x-ray crystallography. If the second round of crystallization screening does not produce crystals suitable for x-ray crystallography, a third reagent mix design is created and analyzed. If necessary additional reagent mix designs are created and analyzed.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of automated macromolecular crystallization screening a sample, comprising:
    randomly selecting reagent components from a set of reagents and creating a multiplicity of initial random reagent mixes of said reagent components to produce an initial multiplicity of said reagent components,
    creating an initial multiplicity of analysis plates wherein each of said analysis plates contains said initial random reagent mixes of said reagent mixes combined with said samples,
    incubating said initial analysis plates to promote growth of crystals in said analysis plates,
    creating images of said crystals,
    analyzing said images with regard to suitability of said crystals for analysis by x-ray crystallography and providing a design of reagent mixes,
    creating a second multiplicity of mixes of said reagent components utilizing said design, and
    using said second multiplicity of reagent mixes for automated macromolecular crystallization screening said sample.

2. The method of automated macromolecular crystallization screening a sample of claim 1, wherein said step of creating images of said crystals utilizes a camera.

3. The method of automated macromolecular crystallization screening a sample of claim 1, wherein said step of randomly selecting reagent components from a set of reagents and creating a multiplicity of initial random reagent mixes of said reagent components utilizes a robot system.

4. The method of automated macromolecular crystallization screening a sample of claim 3, wherein said set of reagents comprises ninety stock solutions.

5. The method of automated macromolecular crystallization screening a sample of claim 4, wherein said ninety stock solutions are divided into five groups.

6. The method of automated macromolecular crystallization screening a sample of claim 5, wherein said five groups consist of precipitant, buffer, pH, additive and detergent.

7. The method of automated macromolecular crystallization screening a sample of claim 1, wherein said step of creating an initial multiplicity of analysis plates wherein each of said analysis plates contains a set format of said initial random reagent mixes combined with said sample utilizes a robot system.

8. The method of automated macromolecular crystallization screening a sample of claim 7, wherein said analysis plates are part of a ninety-six well plate.

9. An automated macromolecular crystallization screening apparatus for a sample, comprising:
    a source of reagent components,
    reagent selection means for creating a multiplicity of reagent mixes of said reagent components wherein said reagent selection means initially randomly selects reagent components from said source of reagent components to produce an initial multiplicity of reagent mixes that are purely random mixes,
    means for creating a multiplicity of analysis plates wherein each of said analysis plates contains a set format of said reagent mixes combined with said sample, incubation means for promoting growth of crystals in said analysis plates, means for creating an image of said crystals, and computer means for analyzing said images with regard to suitability of said crystals for analysis by x-ray crystallography.

10. The automated macromolecular crystallization screening apparatus of claim 9, wherein said reagent selection means comprises a liquid robot system that randomly selects reagent components from said source of reagent components to produce an initial multiplicity of reagent mixes that are purely random mixes.

11. The automated macromolecular crystallization screening apparatus of claim 9, wherein said reagent selection means comprises a programmed cornputer reagent selection means that provides an initial design of reagent mixes that is purely random and wherein said programmed computer reagent selection means creates a second multiplicity of mixes of said reagent components utilizing said source of reagent components.

12. The automated macromolecular crystallization screening apparatus of claim 9, wherein said means for creating an image of said crystals is a camera.

13. The automated macromolecular crystallization screening apparatus of claim 9, wherein said random reagent selection means for creating a multiplicity of reagent mixes of said reagent components is a robot system.

14. The automated macromolecular crystallization screening apparatus of claim 9, wherein said means for creating a multiplicity of analysis plates wherein each of said analysis plates contains a set format of said reagent mixes combined with said sample is a robot system.

15. The automated macromolecular crystallization screening apparatus of claim 9, wherein said source of reagent components comprises ninety stock solutions.

16. The automated macromolecular crystallization screening apparatus of claim 15, wherein said ninety stock solutions are divided into five groups.

17. The automated macromolecular crystallization screening apparatus of claim 16, wherein said five groups consist of precipitant, buffer, pH, additive and detergent.

18. The automated macrormolecular crystallization screening apparatus of claim 9, wherein said analysis plates are part of a ninety-six well plate.

* * * * *